United States Patent
Oh

(10) Patent No.: US 11,302,711 B2
(45) Date of Patent: Apr. 12, 2022

(54) THREE-DIMENSIONAL MEMORY DEVICES HAVING A BACKSIDE TRENCH ISOLATION AND METHODS FOR FORMING THE SAME

(71) Applicant: YANGTZE MEMORY TECHNOLOGIES CO., LTD., Wuhan (CN)

(72) Inventor: Jin Yong Oh, Santa Clara, CA (US)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 51 days.

(21) Appl. No.: 16/802,403

(22) Filed: Feb. 26, 2020

(65) Prior Publication Data

US 2021/0233927 A1 Jul. 29, 2021

Related U.S. Application Data

(63) Continuation of application No. PCT/CN2020/074057, filed on Jan. 28, 2020.

(51) Int. Cl.
*H01L 27/11582* (2017.01)
*H01L 21/306* (2006.01)
(Continued)

(52) U.S. Cl.
CPC .. *H01L 27/11582* (2013.01); *H01L 21/30604* (2013.01); *H01L 21/31111* (2013.01);
(Continued)

(58) Field of Classification Search
CPC ......... H01L 27/11556; H01L 27/11582; H01L 27/11521; H01L 27/11568;
(Continued)

(56) References Cited

U.S. PATENT DOCUMENTS 10,236,301 B1 3/2019 Howder et al.
10,510,415 B1 * 12/2019 Huo .................. H01L 27/11556
(Continued)

FOREIGN PATENT DOCUMENTS

CN 108987408 A 12/2018
CN 109148457 A 1/2019
(Continued)

OTHER PUBLICATIONS

Machine translation of IDS reference CN110246846, published Sep. 17, 2019.*

*Primary Examiner* — Younes Boulghassoul
(74) *Attorney, Agent, or Firm* — Bayes PLLC

(57) ABSTRACT

Embodiments of 3D memory devices and methods for forming the same are disclosed. In an example, a 3D memory device includes a substrate having a first side and a second side opposite to the first side. The 3D memory device also includes a memory stack including interleaved conductive layers and dielectric layers at the first side of the substrate. The 3D memory device also includes a plurality of channel structures each extending vertically through the memory stack. The 3D memory device also includes a slit structure extending vertically through the memory stack and extending laterally to separate the plurality of channel structures into a plurality of blocks. The 3D memory device further includes a first doped region in the substrate and in contact with the slit structure. The 3D memory device further includes an insulating structure extending vertically from the second side of the substrate to the first doped region. The 3D memory device further includes a plurality of second doped regions in the substrate and separated by the insulating structure.

20 Claims, 12 Drawing Sheets

(51) Int. Cl.
  *H01L 21/311* (2006.01)
  *H01L 21/762* (2006.01)
  *H01L 23/522* (2006.01)
  *H01L 23/528* (2006.01)
  *H01L 23/48* (2006.01)
  *H01L 27/11573* (2017.01)
  *H01L 27/11575* (2017.01)
  *H01L 27/11556* (2017.01)

(52) U.S. Cl.
  CPC ...... *H01L 21/76224* (2013.01); *H01L 23/481* (2013.01); *H01L 23/528* (2013.01); *H01L 23/5226* (2013.01); *H01L 27/11556* (2013.01); *H01L 27/11573* (2013.01); *H01L 27/11575* (2013.01)

(58) Field of Classification Search
  CPC .......... H01L 27/11551–11556; H01L 27/11578–11582; H01L 27/1124; H01L 27/1157; H01L 27/11529; H01L 27/11573
  See application file for complete search history.

(56) References Cited

U.S. PATENT DOCUMENTS

| | | | |
|---|---|---|---|
| 2019/0013326 A1* | 1/2019 | Hua | H01L 27/11582 |
| 2019/0043879 A1* | 2/2019 | Lu | H01L 23/5226 |
| 2019/0057974 A1 | 2/2019 | Lu et al. | |
| 2019/0081069 A1* | 3/2019 | Lu | H01L 27/11573 |
| 2019/0096901 A1 | 3/2019 | Dai et al. | |
| 2020/0411541 A1* | 12/2020 | Oh | H01L 27/11575 |
| 2021/0035965 A1* | 2/2021 | Mizutani | H01L 25/0657 |
| 2021/0233923 A1* | 7/2021 | Oh | H01L 23/5384 |

FOREIGN PATENT DOCUMENTS

| | | |
|---|---|---|
| CN | 109427800 A | 3/2019 |
| CN | 109690775 A | 4/2019 |
| CN | 109860197 A | 6/2019 |
| CN | 110211966 A | 9/2019 |
| CN | 110246846 A | 9/2019 |
| CN | 110729305 A | 1/2020 |

* cited by examiner

200

THREE-DIMENSIONAL MEMORY DEVICES HAVING A BACKSIDE TRENCH ISOLATION AND METHODS FOR FORMING THE SAME

CROSS-REFERENCE TO RELATED APPLICATIONS

This application is continuation of International Application No. PCT/CN2020/074057, filed on Jan. 28, 2020, entitled "THREE-DIMENSIONAL MEMORY DEVICES AND METHODS FOR FORMING THE SAME," which is hereby incorporated by reference in its entirety. This application is also related to U.S. application Ser. No. 16/802,391, filed on Feb. 26, 2020, entitled "THREE-DIMENSIONAL MEMORY DEVICES AND METHODS FOR FORMING THE SAME," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and methods for forming the same are disclosed herein.

In an example, a 3D memory device includes a substrate having a first side and a second side opposite to the first side. The 3D memory device also includes a memory stack including interleaved conductive layers and dielectric layers at the first side of the substrate. The 3D memory device also includes a plurality of channel structures each extending vertically through the memory stack. The 3D memory device also includes a slit structure extending vertically through the memory stack and extending laterally to separate the plurality of channel structures into a plurality of blocks. The 3D memory device further includes a first doped region in the substrate and in contact with the slit structure. The 3D memory device further includes an insulating structure extending vertically from the second side of the substrate to the first doped region. The 3D memory device further includes a plurality of second doped regions in the substrate and separated by the insulating structure.

In another example, a 3D memory device includes a first semiconductor structure including a peripheral circuit, a second semiconductor structure, and a joining interface between the first semiconductor structure and the second semiconductor structure. The second semiconductor structure includes a memory stack including interleaved conductive layers and dielectric layers. The second semiconductor structure also includes a plurality of channel structures each extending vertically through the memory stack and electrically connected to the peripheral circuit. The second semiconductor structure also includes a plurality of slit structures each extending vertically through the memory stack and extending laterally to separate the plurality of channel structures into a plurality of blocks. The second semiconductor structure further includes a semiconductor layer including a plurality of first doped regions each in contact with a respective one of the plurality of slit structures, and a plurality of second doped regions in contact with the plurality of first doped regions. The second semiconductor structure further includes a plurality of insulating structures each extending vertically from a backside of the semiconductor layer to a respective one of the plurality of first doped regions to separate the plurality of second doped regions into the blocks.

In still another example, a method for forming a 3D memory device is disclosed. A doped area is formed from a first side of a substrate in the substrate. A plurality of channel structures each extending vertically through a memory stack at the first side of a substrate are formed. A first doped region is formed in the substrate and in contact with the doped area. A slit structure extending vertically through the memory stack to the first doped region, and extending laterally to separate the plurality of channel structures into a plurality of blocks is formed. An insulating structure extending vertically from the second side of the substrate to the first doped region is formed to separate the doped area into a plurality of second doped regions.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
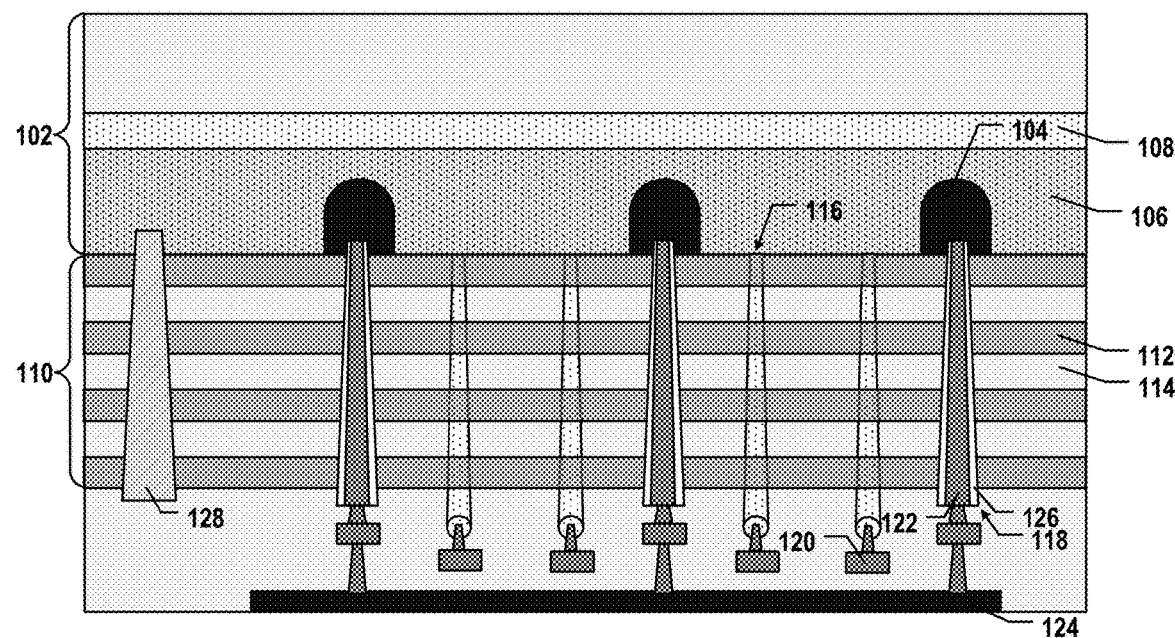
FIG. 1 illustrates a cross-section of a 3D memory device.
Figure 1:
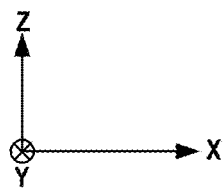

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or vertical interconnect access (VIA) contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D NAND memory devices, the source side of the memory array cells is touched by wall-shaped line contacts in the word line direction. These wall-shaped contacts, also known as array common source (ACS) contacts, are formed per every two or more memory strings along the bit line direction. The ACS contacts embedded in the memory stack, however, hold large coupling capacitance to the word lines in the memory stack. Moreover, the source side of the source select gates, for example including PN-wells, spans across all of the memory blocks in a plane and electrically connect all the memory block and thus, also holds a large capacitive loading. The parasitic capacitance from the conventional wall-type ACS contacts as well as the large PN-wells loading attribute to slow ramping and large current consumption in memory erase and program operations.

For example, FIG. 1 illustrates a cross-section of a 3D memory device 100. 3D memory device 100 includes a P-type substrate 102 having a plurality of N-wells 104, a P-well 106 in contact with each of N-wells 104, and an N-well 108 in contact with P-well 106. 3D memory device 100 also includes a memory stack 110 having interleaved conductive layers 112 (functioning as gate lines/word lines) and dielectric layers 114 at the front side of substrate 102. It is noted that x-, y-, and z-axes are included in FIG. 1 to illustrate the spatial relationships of the components in 3D memory device 100. Substrate 102 includes two lateral surfaces extending laterally in the x-y plane: a front surface on the front side of the wafer, and a back surface on the backside opposite to the front side of the wafer. The x- and y-directions are two orthogonal directions in the wafer plane: x-direction is the word line direction, and the y-direction is the bit line direction. The z-axis is perpendicular to both the x- and y-axes. As used herein, whether one component (e.g., a layer or a device) is "on," "above," or "below" another component (e.g., a layer or a device) of a semiconductor device (e.g., 3D memory device 100) is determined relative to the substrate of the semiconductor device (e.g., substrate 102) in the z-direction (the vertical direction perpendicular to the x-y plane) when the substrate is positioned in the lowest plane of the semiconductor device in the z-direction. The same notion for describing spatial relationships is applied throughout the present disclosure.

As shown in FIG. 1, 3D memory device 100 further includes an array of channel structures 116 (functioning as NAND memory strings) and a plurality of parallel slit structure 118, each of which extends vertically (in the z-direction) through interleaved conductive layers 112 and dielectric layers 114 of memory stack 110. Each channel structure 116 is electrically connected to a respective one of bit lines 120. Each slit structure 118, also known as gate line slit (GLS), extends laterally as well along the bit line direction (y-direction) to separate the array of channel structures 116 into a plurality of memory blocks. Functioning as the ACS contact, each slit structure 118 includes a wall-shaped contact 122 in contact with a respective one of N-wells 104 to electrically connect the respective PN-wells of the ACS to a source line 124. Each wall-shaped contact 122 is surrounded and electrically insulated from conductive layers (word lines) 112 by a spacer 126 made of dielectric material(s) in slit structure 118.

As a result, wall-shaped contacts 122 extending vertically through memory stack 110 form large coupling capacitance against conductive layers (word lines) 112, which keeps increasing as the number of word lines 112 increases when the memory cells scale up vertically. Moreover, channel structures 116 in different memory blocks share the same PN-wells 106 and 108 as their ACS. Thus, a single contact 128 is formed in contact with P-well 106 to apply the common source voltage to P-well 106, which spans across all the memory blocks in a memory plane. PN-wells 106 and 108 hold a large capacitive loading as well, attributing to slow ramping and large current consumption in memory erase and program operations.

Various embodiments in accordance with the present disclosure provide improved 3D memory device architectures and fabrication methods thereof to reduce the various types of parasitic capacitance described above, for example, with respect to FIG. 1, thereby increasing the word line bias ramping speed and reducing power consumption of the 3D memory devices. In some embodiments, conventional front side, wall-type ACS contacts are replaced with backside source line contacts. As a result, the slit structures embedded in the memory stack can be fully filled with dielectric materials, i.e., becoming insulating structures, to avoid coupling capacitance against the word lines. In some embodiments, the single PN-wells of the ACS is split by forming insulating structures from the backside of the substrate, e.g., trench isolations, per memory block, thereby dividing the large PN-wells capacitance by the number of blocks. Moreover, multiple P-wells can be individually controlled at the block level using multiple block selection switches, e.g., by applying a smaller P-well voltage per block, to reduce the P-well loading to further improve the device performance. In some embodiments, the backside source line contacts are formed through and surrounded by the trench isolations.

Figure 2:
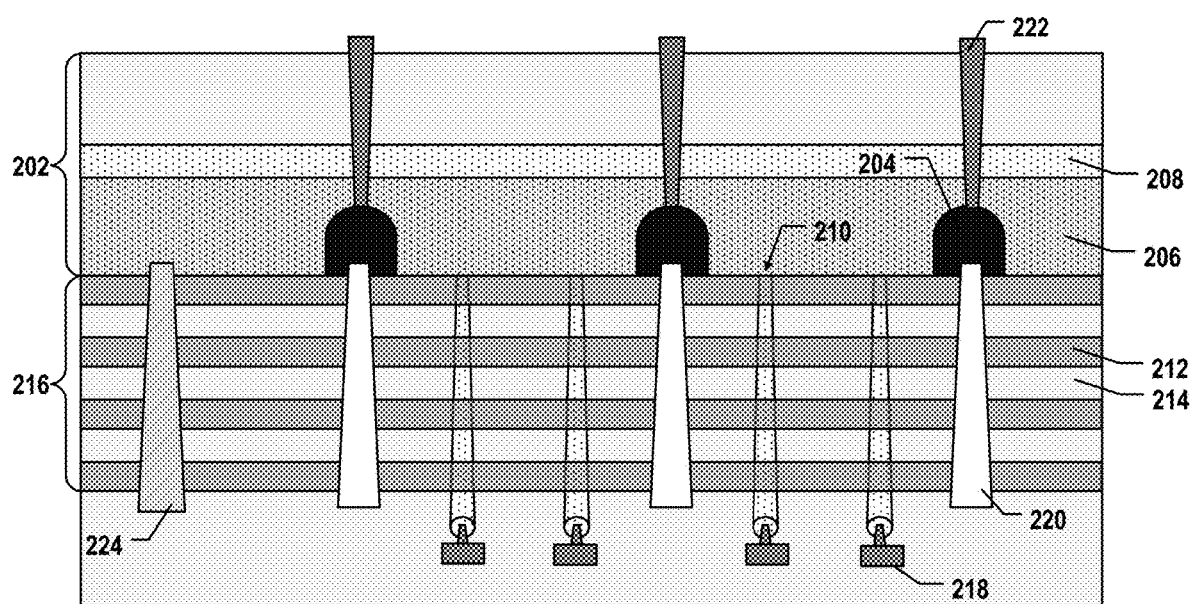
FIG. 2 illustrates a cross-section of an exemplary 3D memory device, according to some embodiments of the present disclosure.
Figure 2:
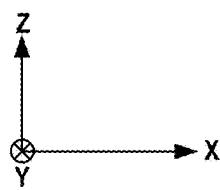

FIG. 2 illustrates a cross-section of an exemplary 3D memory device 200, according to some embodiments of the present disclosure. 3D memory device 200 can include a substrate 202, which can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 202 is a semiconductor layer thinned from a wafer with a normal thickness, i.e., a thinned substrate. Substrate 202 can have the front side at which semiconductor devices, such as memory cells, can be formed, and the backside opposite to the front side.

As shown in FIG. 2, substrate 202 includes a variety of doped regions including a plurality of first doped regions 204 having the same type of dopant (P-type dopant or N-type dopant), a second doped region 206 having a different type of dopant from first doped regions 204, and a third doped region 208 having a different type of dopant from second doped region 206, according to some embodiments. That is, a single second doped region 206 can be in contact with multiple first doped regions 204 to form multiple PN junctions, and a single third doped region 208 can be in contact with a single second doped region 206 to form another PN junction. In some embodiments, substrate 202 is a P-type substrate, each first doped region 204 includes an N-well, second doped region 206 includes a P-well, and third doped region 208 includes an N-well. That is, single second doped region 206 can span across multiple first doped regions 204. In some embodiments, first doped regions 204 and second doped region 206 are doped from the front side of substrate 202.

In some embodiments, 3D memory device 200 is a NAND Flash memory device in which memory cells are provided in the form of an array of NAND memory strings. Each memory string can include a channel structure 210 extending vertically through a plurality of pairs each including a conductive layer 212 and a dielectric layer 214 (referred to herein as "conductive/dielectric layer pairs"). The stacked conductive/dielectric layer pairs are also referred to herein as a memory stack 216 at the front side of substrate 202. The number of the conductive/dielectric layer pairs in memory stack 216 (e.g., 32, 64, 96, or 128) determines the number of memory cells in 3D memory device 200. Memory stack 216 can include interleaved conductive layers 212 and dielectric layers 214. Conductive layers 212 and dielectric layers 214 in memory stack 216 can alternate in the vertical direction. Conductive layers 212 can include conductive materials including, but not limited to, tungsten (W), cobalt (Co), copper (Cu), aluminum (Al), polysilicon, doped silicon, silicides, or any combination thereof. Dielectric layers 214 can include dielectric materials including, but not limited to, silicon oxide, silicon nitride, silicon oxynitride, or any combination thereof. In some embodiments, each conductive layer 212 of memory stack 216 includes a metal, such as tungsten, and each dielectric layer 214 includes silicon oxide.

Channel structure 210 can include a channel hole filled with semiconductor materials (e.g., as a semiconductor channel) and dielectric materials (e.g., as a memory film). In some embodiments, the semiconductor channel includes silicon, such as amorphous silicon, polysilicon, or single crystalline silicon. In some embodiments, the memory film is a composite layer including a tunneling layer, a storage layer (also known as a "charge trap layer"), and a blocking layer. The remaining space of the channel hole of channel structure 210 can be partially or fully filled with a capping layer including dielectric materials, such as silicon oxide. Channel structure 210 can have a cylinder shape (e.g., a pillar shape). The capping layer, semiconductor channel, tunneling layer, storage layer, and blocking layer are arranged radially from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof.

In some embodiments, conductive layer 212 in memory stack 216 functions as a gate conductor/gate line of memory cells in the NAND memory string. Conductive layer 212 can include multiple control gates of multiple NAND memory cells and can extend laterally (e.g., in the x-direction as shown in FIG. 2) as a word line ending at the edge of memory stack 216 (e.g., in a staircase structure of 3D memory device 200). In some embodiments, one end of each channel structure 210 is electrically connected to a respective one of bit lines 218 extending laterally (e.g., in the y-direction as shown in FIG. 2) perpendicular to word lines 212. In some embodiments, the other end of each channel structure 210 is in contact with second doped region 206, e.g., P-well, to electrically connect each channel structure 210 to second doped region 206.

As shown in FIG. 2, 3D memory device 200 further includes a plurality of insulating structures 220 each extending vertically through interleaved conductive layers 212 and dielectric layers 214 of memory stack 216. Each insulating structure 220 can also extend laterally (e.g., in the y-direction as shown in FIG. 2) to separate channel structures 210 into a plurality of blocks. That is, memory stack 216 can be divided into a plurality of memory blocks by insulating structures 220, such that the array of channel structures 210 can be separated into each memory block. In some embodiments, each insulating structure 220 is in contact with a respective one of first doped regions 204, e.g., N-wells, in substrate 202. Different from the counterpart slit structure 118 in 3D memory device 100 in FIG. 1, which includes a wall-shaped contact 122 as the ACS contact at the front side of substrate 102, insulating structure 220 in FIG. 2 does not include any contact therein (i.e., not functioning as the source contact) and thus, does not introduce parasitic capacitance against conductive layers (word lines) 212 like slit structure 118. In some embodiments, each insulating structure 220 includes a slit opening (e.g., a trench) filled with one or more dielectric materials, including, but not limited to, silicon oxide, silicon nitride, silicon oxynitride, or any combination thereof. In one example, each insulating structure 220 may be fully filled with silicon oxide.

Instead of the front side source contacts (e.g., wall-shaped contacts 122 in slit structures 118 of 3D memory device 100 in FIG. 1), 3D memory device 200 can include a plurality of backside source contacts 222 each extending vertically through second doped region 206 of substrate 202 to be in contact with a respective one of first doped regions 204, as shown in FIG. 2. That is, source contact 222 extends vertically from the backside of substrate 202 to be in contact with respective first doped region 204, e.g., an N-well, in substrate 202. Source contacts 222 can include any suitable types of contacts. In some embodiments, source contacts 222 include a VIA contact. In some embodiments, source contacts 222 include a wall-shaped contact, for example, extending laterally in the y-direction in FIG. 2. Backside source contacts 222 can be electrically connected to one or more source lines or a source line mesh (not shown) at the backside of substrate 202.

In some embodiments, 3D memory device 200 further includes a contact 224 in contact with second doped region 206, e.g., a P-well. Contact 224 can electrically connect second doped region 206 to a selection switch, e.g., a transistor, and/or the peripheral circuit (not shown) of 3D memory device 200 for controlling the voltage applied to second doped region 206. As shown in FIG. 2, contact 224 can extend to the front side of substrate 202, e.g., extending vertically from second doped region 206 of substrate 202 through memory stack 216. It is understood that in some embodiments, contact 224 may extend to the backside of substrate 202, e.g., extending vertically from second doped region 206 through substrate 202.

Figure 3A:
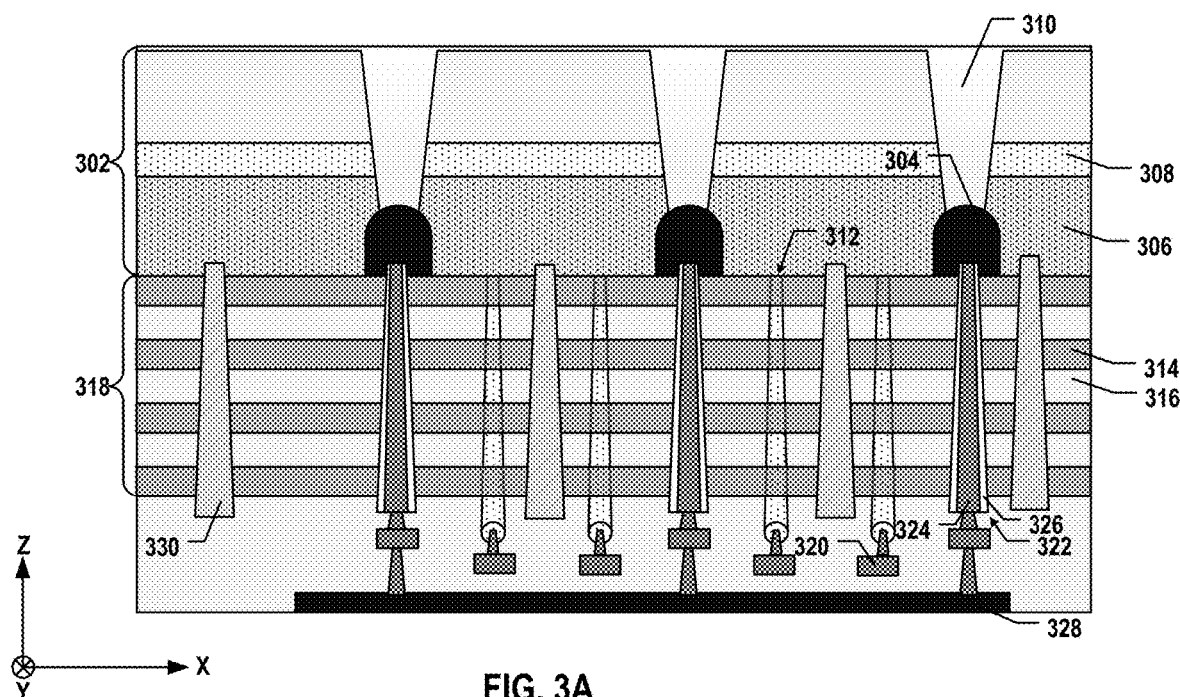
FIG. 3A illustrates a cross-section of another exemplary 3D memory device, according to some embodiments of the present disclosure.

FIG. 3A illustrates a cross-section of another exemplary 3D memory device 300, according to some embodiments of the present disclosure. 3D memory device 300 can include a substrate 302, which can include silicon (e.g., single crystalline silicon), SiGe, GaAs, Ge, SOI, GOI, or any other suitable materials. In some embodiments, substrate 302 is a semiconductor layer thinned from a wafer with a normal thickness, i.e., a thinned substrate. Substrate 302 can have the front side at which semiconductor devices, such as memory cells, can be formed, and the backside opposite to the front side.

As shown in FIG. 3A, substrate 302 includes a variety of doped regions including a plurality of first doped regions 304 having the same type of dopant (P-type dopant or N-type dopant), a plurality of second doped regions 306 having the same type of dopant (P-type dopant or N-type dopant) but that is different from first doped regions 304, and a plurality of third doped region 308 having the same type of dopant (P-type dopant or N-type dopant) but that is different from second doped region 306, according to some embodiments. In some embodiments, first doped regions 304 and second doped regions 306 are doped from the front side of substrate 302. Different from substrate 102 of 3D memory device 100 in FIG. 1 in which a single P-well 106 spans across multiple N-wells 104, substrate 302 of 3D memory device 300 in FIG. 3A includes a plurality of separate second doped regions 306 in contact with a plurality of first doped regions 304.

As shown in FIG. 3A, 3D memory device 300 can include a plurality of backside insulating structures 310 each extending vertically from the backside of substrate 302 to a respective one of first doped regions 304 to separate second doped regions 306 and third doped regions 308. Each backside insulating structure 310 can include a trench isolation, i.e., a trench filled with one or more dielectric materials including, but not limited to, silicon oxide, silicon nitride, silicon oxynitride, or any combination thereof. In some embodiments, second doped regions 306 are in contact with first doped regions 304 and are separated by backside insulating structures 310 as well as first doped regions 304. That is, adjacent second doped regions 306 are not electrically connected to each other and thus, need to be individually driven, i.e., being applied with separate voltage signals, according to some embodiments. In some embodiments, third doped regions 308 are in contact with second doped regions 306, respectively, and are separated by backside insulating structures 310 as well. That is, adjacent third doped regions 308 are not electrically connected to each other, according to some embodiments. In some embodiments, substrate 302 is a P-type substrate, each first doped region 304 includes an N-well, each second doped region 306 includes a P-well, and each third doped region 308 includes an N-well. As a result, the PN-wells capacitance of each second doped region 306 can be reduced compared with the PN-wells capacitance of a single P-well 106 in FIG. 1, thereby saving power consumption of 3D memory device 300.

In some embodiments, 3D memory device 300 is a NAND Flash memory device in which memory cells are provided in the form of an array of NAND memory strings. Each memory string can include a channel structure 312 extending vertically through a plurality of pairs each including a conductive layer 314 and a dielectric layer 316 (referred to herein as "conductive/dielectric layer pairs"). The stacked conductive/dielectric layer pairs are also referred to herein as a memory stack 318 at the front side of substrate 302. The number of the conductive/dielectric layer pairs in memory stack 318 (e.g., 32, 64, 96, or 128) determines the number of memory cells in 3D memory device 300. Memory stack 318 can include interleaved conductive layers 314 and dielectric layers 316. Conductive layers 314 and dielectric layers 316 in memory stack 318 can alternate in the vertical direction. Conductive layers 314 can include conductive materials including, but not limited to, W, Co, Cu, Al, polysilicon, doped silicon, silicides, or any combination thereof. Dielectric layers 316 can include dielectric materials including, but not limited to, silicon oxide, silicon nitride, silicon oxynitride, or any combination thereof. In some embodiments, each conductive layer 314 of memory stack 318 includes a metal, such as tungsten, and each dielectric layer 316 includes silicon oxide.

Channel structure 312 can include a channel hole filled with semiconductor materials (e.g., as a semiconductor channel) and dielectric materials (e.g., as a memory film). In some embodiments, the semiconductor channel includes silicon, such as amorphous silicon, polysilicon, or single crystalline silicon. In some embodiments, the memory film is a composite layer including a tunneling layer, a storage layer (also known as a "charge trap layer"), and a blocking layer. The remaining space of the channel hole of channel structure 312 can be partially or fully filled with a capping layer including dielectric materials, such as silicon oxide. Channel structure 312 can have a cylinder shape (e.g., a pillar shape). The capping layer, semiconductor channel, tunneling layer, storage layer, and blocking layer are arranged radially from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high-k dielectrics, or any combination thereof.

In some embodiments, conductive layer 314 in memory stack 318 functions as a gate conductor/gate line of memory cells in the NAND memory string. Conductive layer 314 can include multiple control gates of multiple NAND memory cells and can extend laterally (e.g., in the x-direction as shown in FIG. 3A) as a word line ending at the edge of memory stack 318 (e.g., in a staircase structure of 3D memory device 300). In some embodiments, one end of each channel structure 312 is electrically connected to a respective one of bit lines 320 extending laterally (e.g., in the y-direction as shown in FIG. 3A) perpendicular to word lines 314. In some embodiments, the other end of each channel structure 312 is in contact with one of second doped regions 306, e.g., P-well, to electrically connect each channel structure 312 to one of second doped regions 306.

As shown in FIG. 3A, 3D memory device 300 further includes a plurality of slit structures 322 each extending vertically through interleaved conductive layers 314 and dielectric layers 316 of memory stack 318. Each slit structure 322 can also extend laterally (e.g., in the y-direction as shown in FIG. 3A) to separate channel structures 312 into a plurality of blocks. That is, memory stack 318 can be divided into a plurality of memory blocks by slit structures 322, such that the array of channel structures 312 can be separated into each memory block. In some embodiments, each slit structure 322 is in contact with a respective one of first doped regions 304, e.g., N-wells, in substrate 302. Since each backside insulating structure 310 is also in contact with a respective one of first doped regions 304 from another side, which separates second doped regions 306, second doped regions 306 are separated into the memory blocks as well, according to some embodiments. In other words, second doped regions 306, e.g., N-wells, can be divided per memory block. Similarly, third doped regions 308, e.g., P-wells, can be divided per memory block as well. In some embodiments, each second doped region 306 corresponds to a respective one of the memory blocks, such that channel structures 312 in the respective memory block are in contact with second doped region 306 corresponding to the same memory block.

In some embodiments, each slit structure 322 includes a slit opening (e.g., a trench) filled with a frontside source contact 324 and a spacer 326 surrounding source contact 324. Source contact 324 can include one or more conductive materials including, but not limited to, W, Co, Cu, Al, polysilicon, doped silicon, silicides, or any combination thereof. Spacer 326 can include one or more dielectric materials including, but not limited to, silicon oxide, silicon nitride, silicon oxynitride, or any combination thereof. Spacer 326 can electrically insulate source contact 324 from conductive layer 314 in memory stack 318 and separate memory stack 318 into the blocks. Source contact 324 can be electrically connected to a source line (or a source mesh) 328 to electrically connect respective first doped region 304 to source line 328. It is understood that in some embodiment, slit structure 322 may not include frontside source contact 324, i.e., being filled with one or more dielectric materials like insulating structure 220 in FIG. 2. That is, frontside source contact 324 may be replaced with a backside source contact extending through a respective one of backside insulating structures 310 as described below with respect to FIG. 5.

Figure 3B:
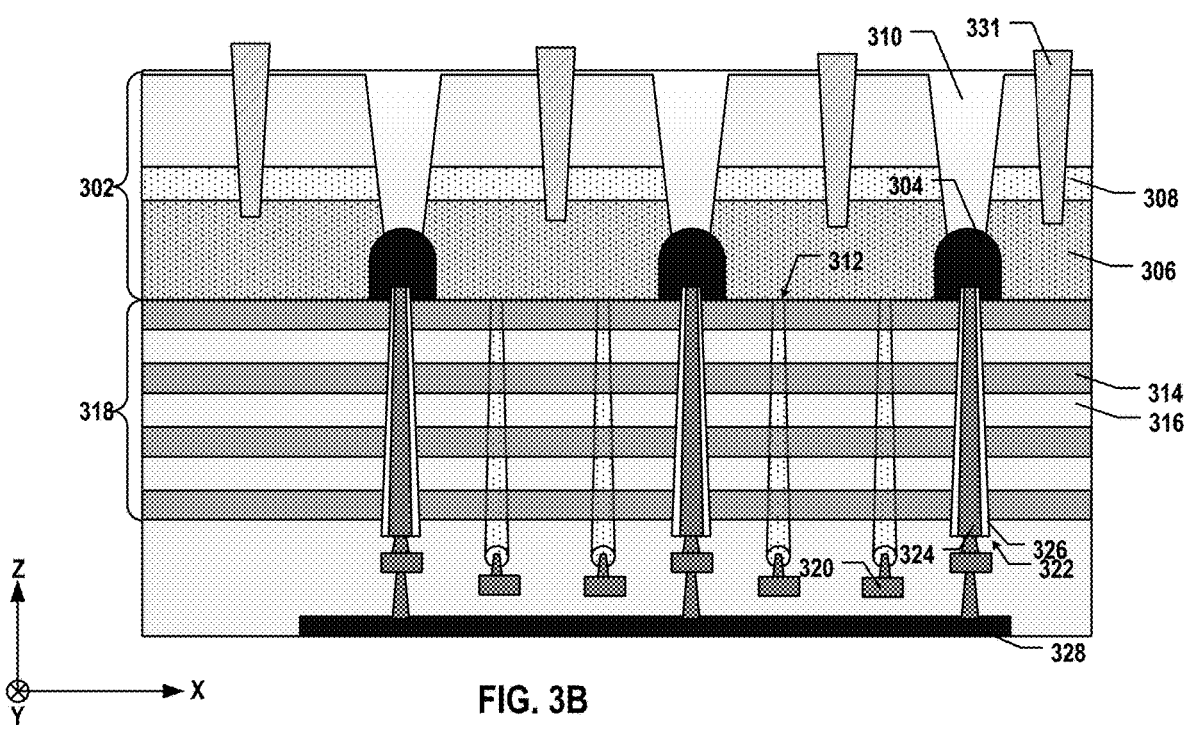
FIG. 3B illustrates a cross-section of still another exemplary 3D memory device, according to some embodiments of the present disclosure.

As shown in FIG. 3A, 3D memory device 300 further includes a plurality of contacts 330 each in contact with a respective one of second doped regions 306, e.g., P-wells, for controlling the voltage of corresponding second doped region 306. Different from 3D memory device 100 in FIG. 1, which includes a single P-well 106 and a single contact 128, 3D memory device 300 in FIG. 3A includes multiple separate second doped regions 306, which in turn require multiple contacts 330 for applying voltage signals individually. Each contact 330 can electrically connect corresponding second doped region 306 to a selection switch, e.g., a transistor, and/or the peripheral circuit (not shown) of 3D memory device 300 for controlling the voltage applied to corresponding second doped region 306. As shown in FIG. 3A, each contact 330 can extend to the front side of substrate 302, e.g., extending vertically from corresponding second doped region 306 through memory stack 318. In some embodiments, contacts 330 are formed per memory block, just like second doped regions 306. The P-well voltage in substrate 302 thus can be individually controlled per block. It is understood that in some embodiments, for example, as shown in FIG. 3B, each contact 331 of 3D memory device 301 may extend to the backside of substrate 302, e.g., extending vertically from corresponding second doped region 306 through substrate 302. The per-block arrangement of second doped regions 306 (e.g., resulting in P-well per block) and the individual P-well control per block can thus reduce the P-well loading by the number of blocks. In some embodiments, if second doped regions 306 are separated with backside insulating structures 310, the P-well voltage corresponding to each memory block is controlled according to the address of the memory block.

Figure 4A:
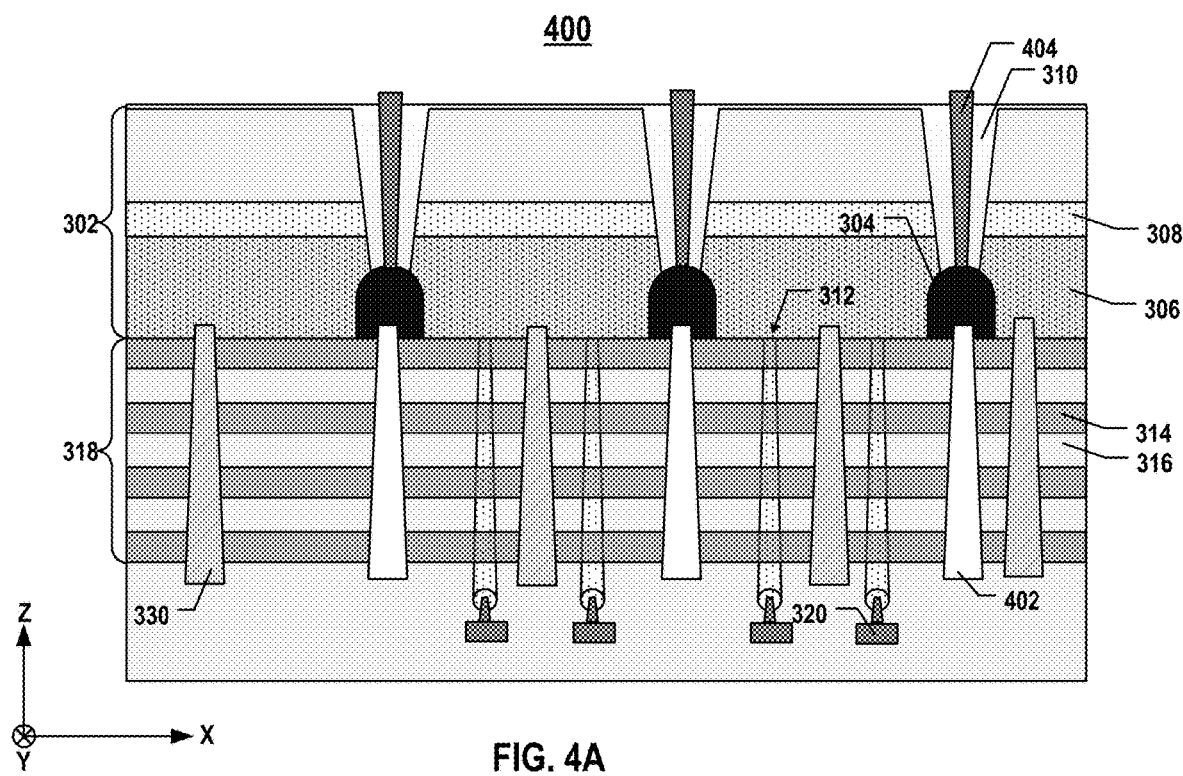
FIG. 4A illustrates a cross-section of yet another exemplary 3D memory device, according to some embodiments of the present disclosure.

FIG. 4A illustrates a cross-section of yet another exemplary 3D memory device 400, according to some embodiments of the present disclosure. As described above with respect to FIG. 2, 3D memory device 200 can reduce the parasitic capacitance between front side ACS contact and word lines by replacing the front side ACS contacts in slit structures with front side insulating structures 220 and backside source contacts 222. As described above with respect to FIGS. 3A and 3B, 3D memory device 300 can reduce the parasitic capacitance of PN-wells by splitting a single P-well into multiple P-wells (second doped regions 306) using backside insulating structures 310. 3D memory device 400 can combine the structural improvements of both 3D memory device 200 and 3D memory device 300 to reduce the parasitic capacitance introduced by both ACS-word lines and PN-wells. For ease of description, 3D memory device 400 will be described based on 3D memory device 300, and the same components in both 3D memory device 300 and 3D memory device 400 are not repeated.

As shown in FIG. 4A, 3D memory device 400 includes a plurality of frontside insulating structures 402 each extending vertically through memory stack 318 and extending laterally (e.g., in the y-direction in FIG. 4A) to separate channel structures 312 into a plurality of blocks, according to some embodiments. Each insulating structure 402 can be in contact with a respective one of first doped regions 304. Instead of slit structures 322 including frontside source contacts 324 and spacers 326, the memory blocks in 3D memory device 400 are divided by insulating structures 402 that do not include conductive materials to avoid the parasitic capacitance against conductive layers 314. In other words, slit structures 322 in FIG. 3A can be fully filled with dielectric materials to become front side insulating structures 402 in 3D memory device 400.

As shown in FIG. 4A, 3D memory device 400 also includes a plurality of backside insulating structures 310 each extending vertically from the backside of substrate 302 to a respective one of first doped regions 304 to separate second doped regions 306 into the blocks. Instead of front side source contacts 322 as shown in FIG. 3A, 3D memory device 400 further includes a plurality of backside source contacts 404 each surrounded by a respective one of backside insulating structures 310 and each extending vertically from the backside of substrate 302 to be in contact with a respective one of first doped regions 304. That is, each backside source contact 404 can penetrate through corresponding backside insulating structure 310 to be electrically connected to corresponding first doped region 304, e.g., an N-well. Source contacts 404 can include any suitable types of contacts. In some embodiments, source contacts 404 include a VIA contact. In some embodiments, source contacts 404 include a wall-shaped contact, for example, extending laterally in the y-direction in FIG. 4A. Backside source contacts 404 can be electrically connected to one or more source lines or a source line mesh (not shown) at the backside of substrate 302.

Figure 4B:
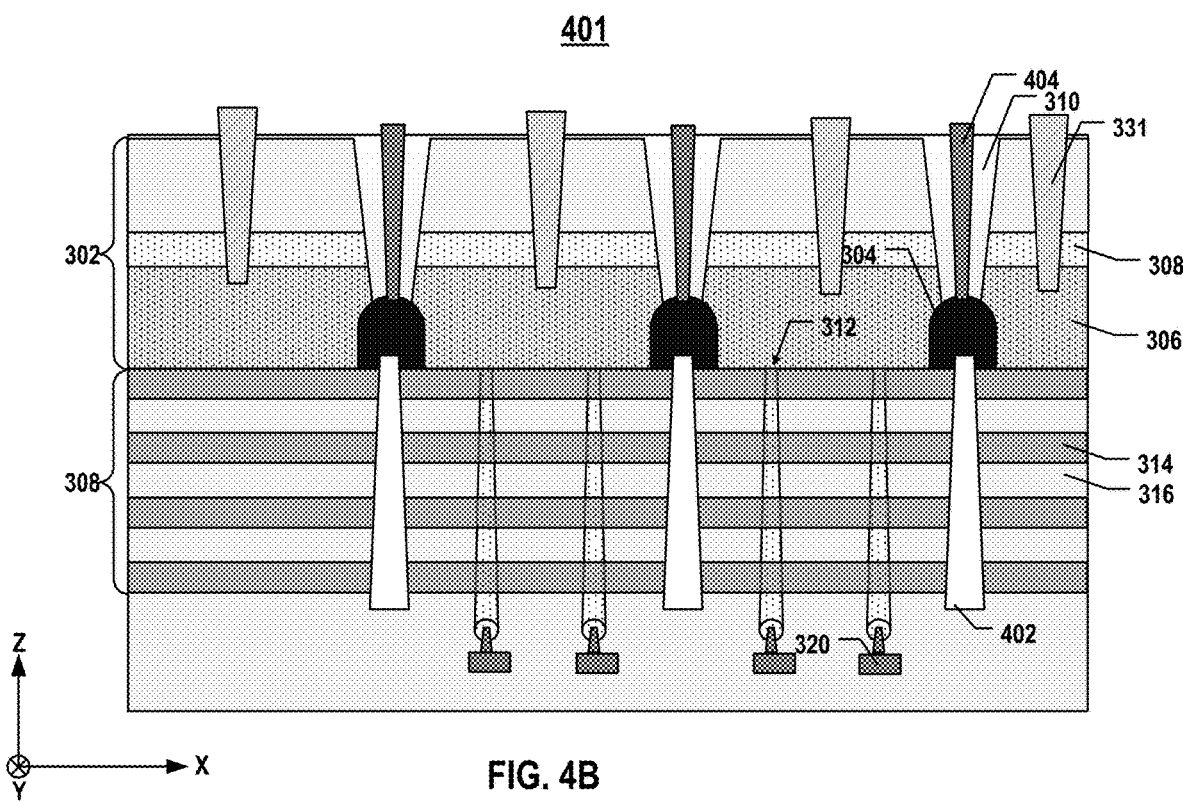
FIG. 4B illustrates a cross-section of yet another exemplary 3D memory device, according to some embodiments of the present disclosure.

As shown in FIG. 4A, 3D memory device 400 further includes a plurality of contacts 330 each in contact with a respective one of second doped regions 306, e.g., P-wells, for controlling the voltage of corresponding second doped region 306. Each contact 330 can electrically connect corresponding second doped region 306 to a selection switch, e.g., a transistor, and/or the peripheral circuit (not shown) of 3D memory device 400 for controlling the voltage applied to corresponding second doped region 306. As shown in FIG. 4A, each contact 330 can extend to the front side of substrate 302, e.g., extending vertically from corresponding second doped region 306 through memory stack 318. In some embodiments, contacts 330 are formed per memory block, just like second doped regions 306. PN-wells in substrate 302 thus can be individually controlled per block. It is understood that in some embodiments, for example, as shown in FIG. 4B, each contact 331 of 3D memory device 401 may extend to the backside of substrate 302, e.g., extending vertically from corresponding second doped region 306 through substrate 302. The per-block arrangement of second doped regions 306 (e.g., resulting in PN-wells per block) and the individual PN-wells control per block can thus reduce the PN-wells loading by the number of blocks.

Figure 5:
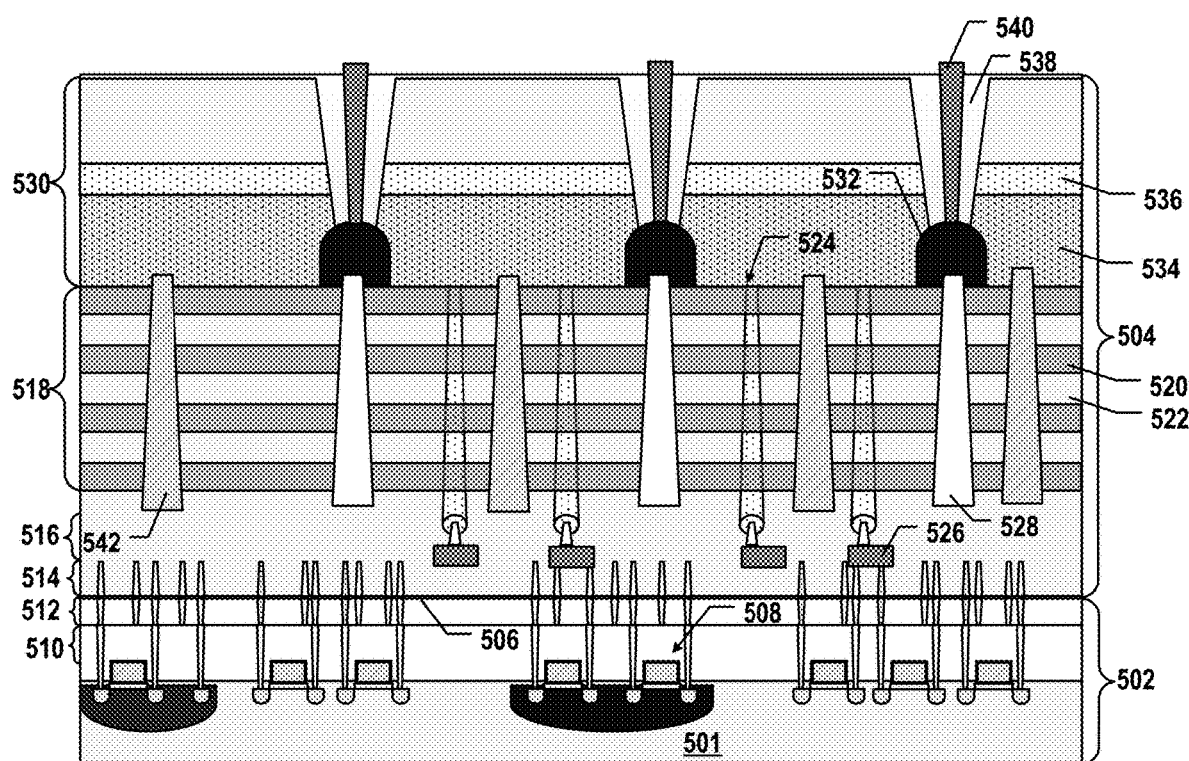
FIG. 5 illustrates a cross-section of an exemplary bonded 3D memory device, according to some embodiments of the present disclosure.

FIG. 5 illustrates a cross-section of an exemplary bonded 3D memory device 500, according to some embodiments of the present disclosure. 3D memory device 500 represents an example of a bonded chip. The components of 3D memory device 500 (e.g., 3D NAND memory cells and peripheral circuits) can be formed separately on different substrates and then jointed to form a bonded chip. 3D memory device 500 can include a first semiconductor structure 502 and a second semiconductor structure 504 stacked over first semiconductor structure 502. First and second semiconductor structures 502 and 504 are jointed at a joining interface 506 therebetween, such as a bonding interface, according to some embodiments. It is understood that in some embodiments, the relative positions of first and second semiconductor structures 502 and 504 may be switched, i.e., first semiconductor structure 502 stacking over second semiconductor structure 504.

In some embodiments, first semiconductor structure 502 includes peripheral circuits. The peripheral circuits can be implemented with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, etc.) to achieve high speed. In some embodiments, the peripheral circuits in first semiconductor structure 502 are using complementary metal-oxide-semiconductor (CMOS) technology. In some embodiments, the peripheral circuits include a plurality of transistors 508 forming any suitable digital, analog, and/or mixed-signal peripheral circuits used for facilitating the operation of 3D memory device 500 including, but not limited to, a page buffer, a decoder (e.g., a row decoder and a column decoder), a sense amplifier, a driver, a charge pump, a current or voltage reference. Transistors 508 can be formed on a substrate 501. Isolation regions (e.g., shallow trench isolations (STIs)) and doped regions (e.g., source regions and drain regions of transistors 508) can be formed in substrate 501 as well.

In some embodiments, first semiconductor structure 502 of 3D memory device 500 further includes an interconnect layer 510 to transfer electrical signals to and from the peripheral circuits. Interconnect layer 510 can include a plurality of interconnects (also referred to herein as "contacts"), including lateral interconnect lines and VIA contacts. As used herein, the term "interconnects" can broadly include any suitable types of interconnects, such as middle-end-of-line (MEOL) interconnects and back-end-of-line (BEOL) interconnects. Interconnect layer 510 can further include one or more interlayer dielectric (ILD) layers (also known as "intermetal dielectric (IMD) layers") in which the interconnect lines and VIA contacts can form. First semiconductor structure 502 of 3D memory device 500 can further include a bonding layer 512 at joining interface 506 (e.g., a bonding interface). Bonding layer 512 can include a plurality of bonding contacts and dielectrics electrically insulating the bonding contacts. The bonding contacts and surrounding dielectrics in bonding layer 512 can be used for hybrid bonding.

Similarly, second semiconductor structure 504 of 3D memory device 500 can also include a bonding layer 514 at joining interface 506 (e.g., a bonding interface). Bonding layer 514 can include a plurality of bonding contacts and dielectrics electrically insulating the bonding contacts. Second semiconductor structure 504 can be bonded on top of first semiconductor structure 502 in a face-to-face manner at joining interface 506. In some embodiments, joining interface 506 is a bonding interface disposed between bonding layers 514 and 512 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some embodiments, the bonding interface is the place at which bonding layers 514 and 512 are met and bonded. In practice, the bonding interface can be a layer with a certain thickness that includes the top surface of bonding layer 512 of first semiconductor structure 502 and the bottom surface of bonding layer 514 of second semiconductor structure 504.

In some embodiments, second semiconductor structure 504 of 3D memory device 500 further includes an interconnect layer 516 to transfer electrical signals. Interconnect layer 516 can include a plurality of interconnects, such as MEOL interconnects and BEOL interconnects. Interconnect layer 516 can further include one or more ILD layers in which the interconnect lines and VIA contacts can form.

In some embodiments, second semiconductor structure 504 of 3D memory device 500 includes a NAND Flash memory device in which memory cells are provided in the form of an array of 3D NAND memory cells in an architecture that is substantially the same as that of 3D memory device 400 in FIG. 4A. It is understood that the details of similar structures, materials, functions, etc. in both 3D memory device 400 and second semiconductor structure 504 may not be repeated below.

Second semiconductor structure 504 can include a memory stack 518 including interleaved conductive layers 520 (e.g., as gate lines and word lines) and dielectric layers 522. In some embodiments, second semiconductor structure 504 also includes a plurality of channel structures 524 each extending vertically through memory stack 518. Each channel structure 524 can be electrically connected to the peripheral circuits of first semiconductor structure 502 through the interconnects, such as bit lines 526, in interconnect layers 516 and 510 and the bonding contacts in bonding layers 514 and 512. Second semiconductor structure 504 can also include a plurality of insulating structures 528 each extending vertically through memory stack 518 and extending laterally to separate channel structures 524 into a plurality of blocks. In some embodiments, each insulating structure 528 is filled with one or more dielectric materials, such as silicon oxide, to avoid the parasitic capacitance against conductive layers 520 in memory stack 518.

Second semiconductor structure 504 can further include a semiconductor layer 530, such as a thinned substrate. In some embodiments, semiconductor layer 530 includes a plurality of first doped regions 532 each in contact with a respective one of insulating structures 528. For example, each first doped region 532 may include an N-well. In some embodiments, semiconductor layer 530 also includes a plurality of second doped regions 534 in contact with first doped regions 532. For example, each second doped region 534 may include a P-well. Each channel structure 524 can be in contact with second doped region 534. In some embodiments, one or more channel structures 524 in each of the blocks are in contact with a respective one of second doped regions 534 in the same block. Semiconductor layer 530 further includes a plurality of third doped regions 536 in contact with second doped regions 534, according to some embodiments. For example, each third doped region 536 may include an N-well.

Second semiconductor structure 504 can further include a plurality of insulating structures 538 each extending vertically from the backside of semiconductor layer 530 to a respective one of first doped regions 532 to separate second doped regions 534 into the blocks. In some embodiments, each insulating structure 538 includes a trench isolation. Second semiconductor structure 504 can further include a plurality of contacts 540 each extending vertically through second doped region 536 of semiconductor layer 530 to be in contact with a respective one of first doped regions 532. Each contact 540 thus can function as a backside source contact. In some embodiments, each contact 540 is surrounded by a respective one of insulating structures 538. Contacts 540 can include a VIA contact or a wall-shaped contact. By dividing a single doped area into multiple separate second doped regions 534 using backside insulating structures 538, the PN-wells capacitance and loading associated with each second doped region 534 can be reduced Second semiconductor structure 504 can further include a plurality of contacts 542 each in contact with a respective one of second doped regions 534 for controlling the voltage of corresponding second doped region 534. Contacts 542 can extend to the front side of semiconductor layer 530, e.g., extending vertically through memory stack 518 as shown in FIG. 5, or extend to the backside of semiconductor layer 530, e.g., extending vertically through semiconductor layer 530 (not shown in FIG. 5). In some embodiments, each contact 542 extends to the front side of semiconductor layer 530 and electrically connects corresponding second doped region 534 to the peripheral circuits of first semiconductor structure 502 through the interconnects in interconnect layers 516 and 510 and the bonding contacts in bonding layers 514 and 512.

Figure 7:
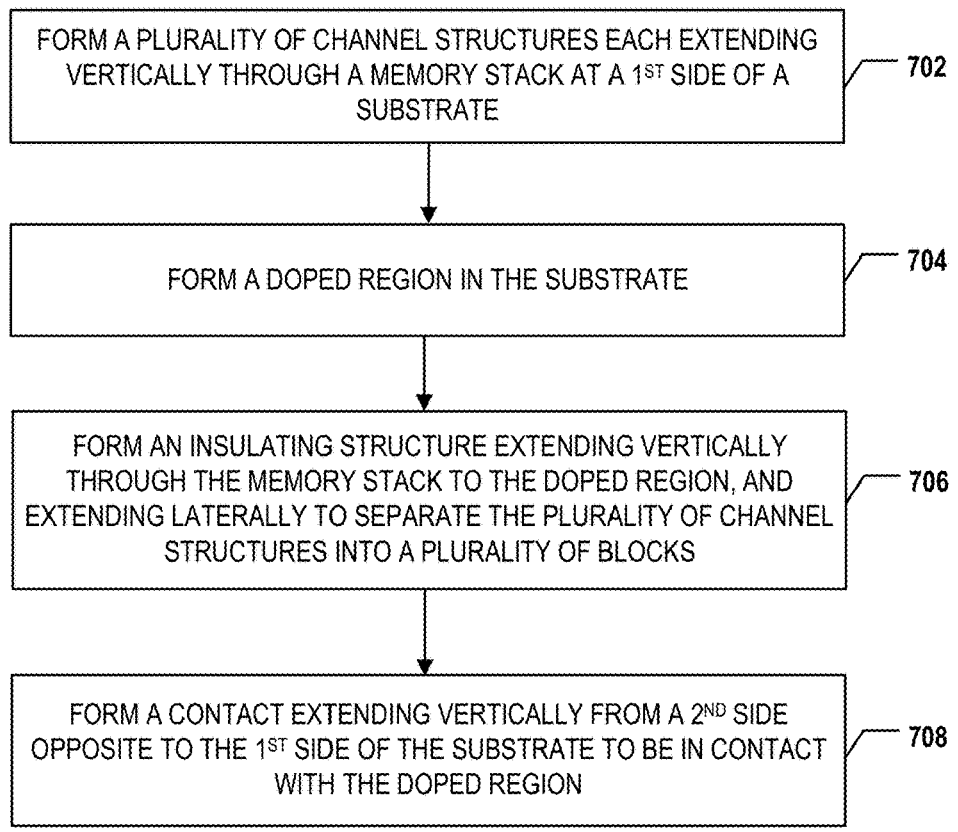
FIG. 7 illustrates a flowchart of an exemplary method for forming a 3D memory device, according to some embodiments of the present disclosure.
Figure 8:
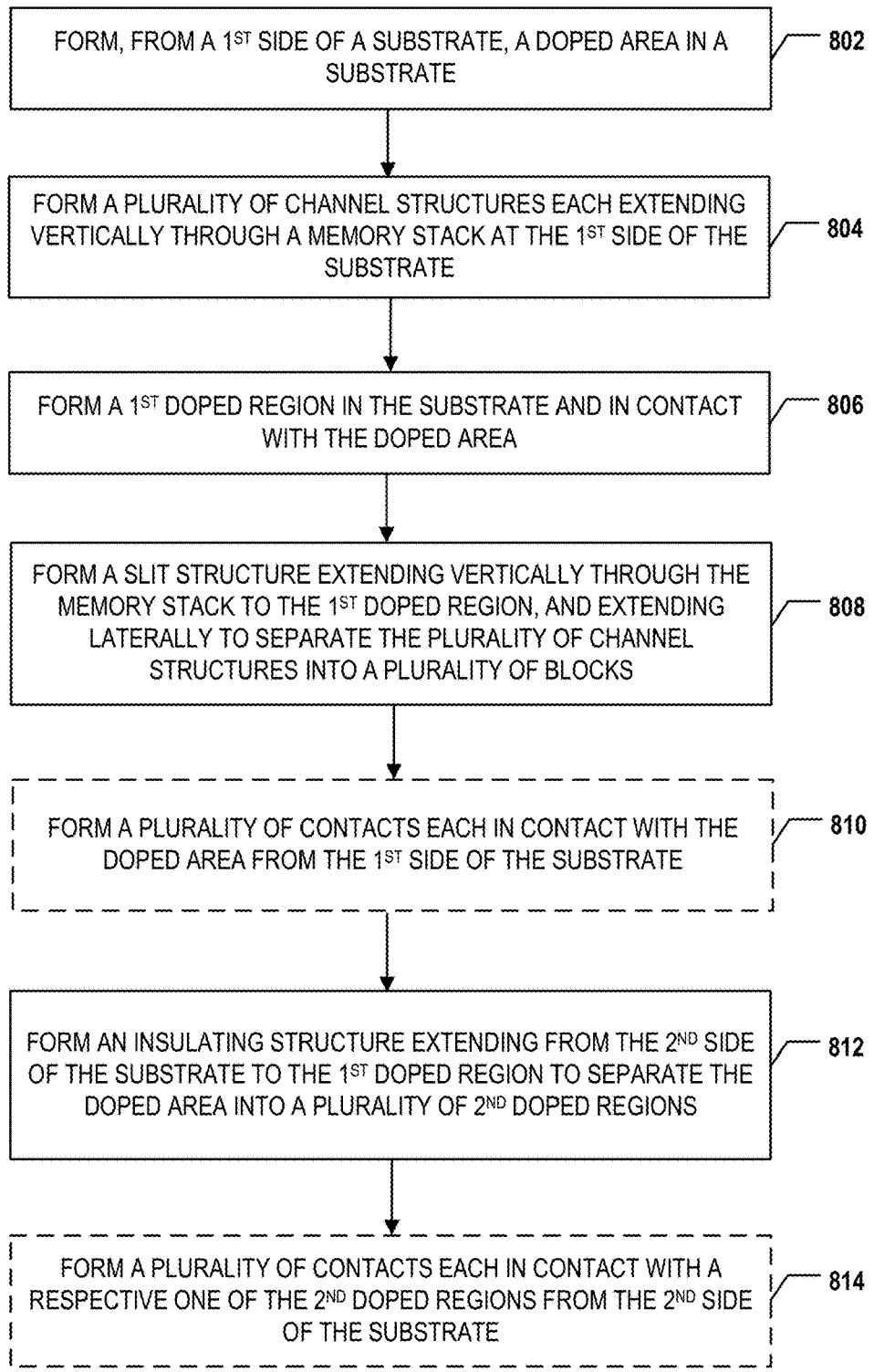
FIG. 8 illustrates a flowchart of another exemplary method for forming a 3D memory device, according to some embodiments of the present disclosure.

FIGS. 6A-6D illustrate an exemplary fabrication process for forming a 3D memory device, according to some embodiments of the present disclosure. FIG. 7 illustrates a flowchart of an exemplary method 700 for forming a 3D memory device (e.g., 3D memory device 200 depicted in FIG. 2), according to some embodiments of the present disclosure. FIG. 8 illustrates a flowchart of another exemplary method 800 for forming a 3D memory device (e.g., 3D memory devices 300 and 301 depicted in FIGS. 3A and 3B), according to some embodiments of the present disclosure.

Figure 9:
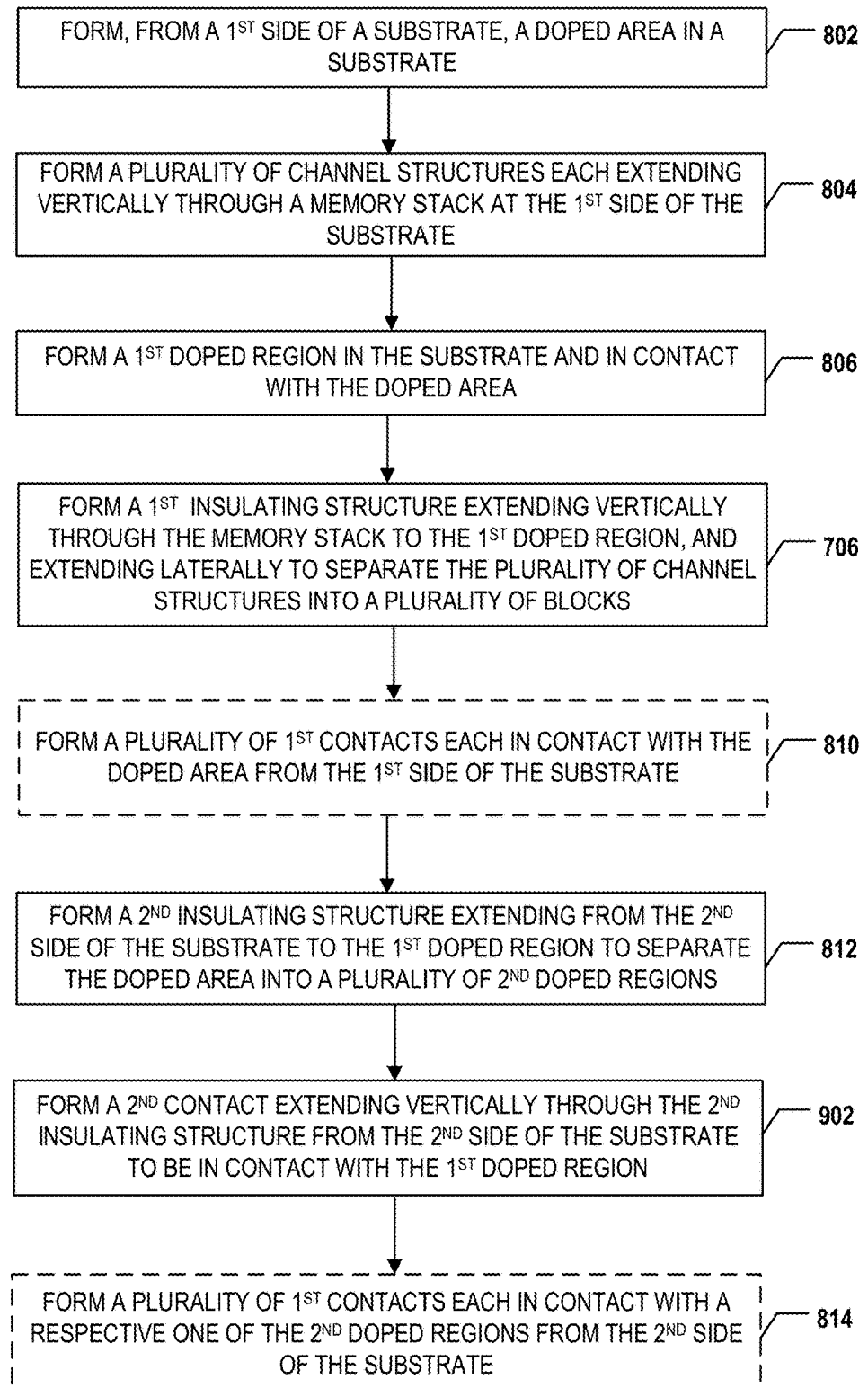
FIG. 9 illustrates a flowchart of still an exemplary method for forming a 3D memory device, according to some embodiments of the present disclosure.

FIG. 9 illustrates a flowchart of still an exemplary method 900 for forming a 3D memory device (e.g., 3D memory devices 400 and 401 depicted in FIGS. 4A and 4B), according to some embodiments of the present disclosure. FIGS. 6A-6D and 7-9 will be described together. It is understood that the operations shown in methods 700, 800, and 900 are not exhaustive and that other operations can be performed as well before, after, or between any of the illustrated operations. Further, some of the operations may be performed simultaneously, or in a different order than shown in FIGS. 7-9.

FIG. 7 illustrates a flowchart of an exemplary method 700 for forming a 3D memory device (e.g., 3D memory device 200 depicted in FIG. 2), according to some embodiments of the present disclosure. Referring to FIG. 7, method 700 starts at operation 702, in which a plurality of channel structures each extending vertically through a memory stack at a first side of a substrate are formed. The substrate can be a silicon substrate, and the first side can be the front side of the substrate. In some embodiments, to form the memory stack, a dielectric stack including interleaved sacrificial layers and dielectric layers are formed at the first side of the substrate, a slit opening extending vertically through the dielectric stack to the substrate is formed, and the memory stack including interleaved conductive layers and the dielectric layers is formed by replacing the sacrificial layers with the conductive layers through the slit opening. In some embodiments, prior to forming the dielectric stack, a second doped region is formed in the substrate. The second doped region can include a P-well. In some embodiments, to form the channel structures, channel holes extending vertically through the dielectric stack are etched, and a memory film and a semiconductor channel are subsequently deposited over sidewalls and bottom surfaces of the channel holes. Each of the channel structures can be in contact with the second doped region.

Figure 6A:
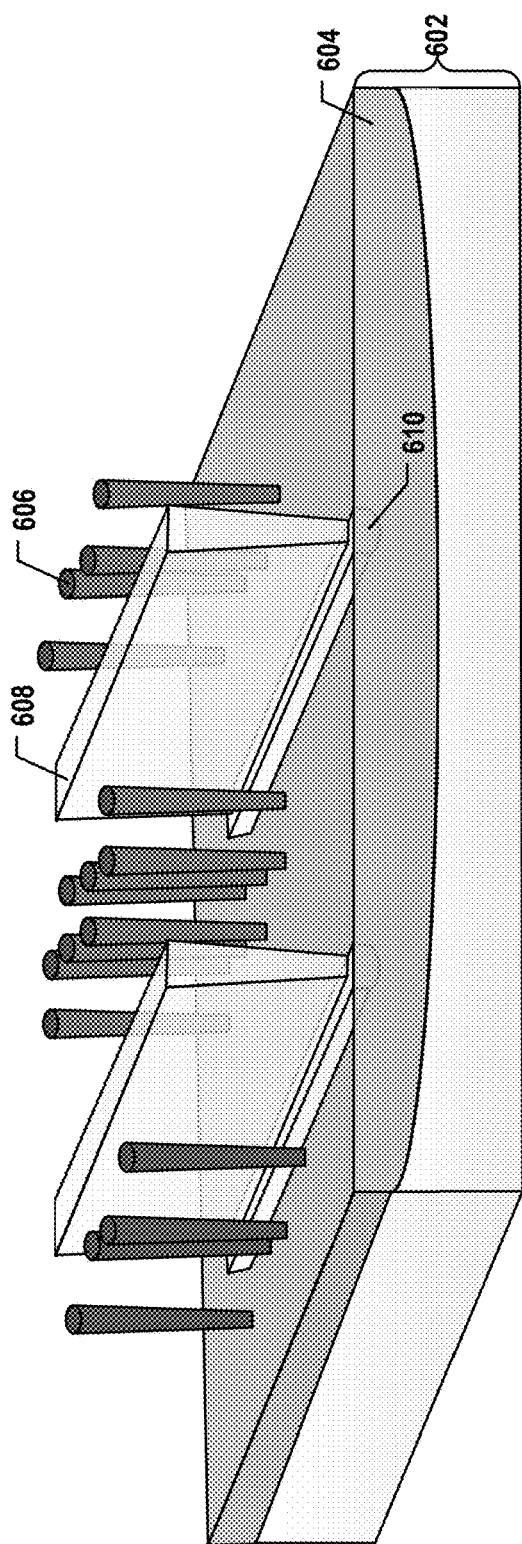
FIGS. 6A-6D illustrate an exemplary fabrication process for forming a 3D memory device, according to some embodiments of the present disclosure.

Referring to FIG. 6A, a doped region 604, such as a P-well, is patterned using photolithography and formed in a silicon substrate 602 using ion implantation, thermal diffusion, or a combination thereof. A plurality of channel structures 606 can be formed at the front side of silicon substrate 602, contacting doped region 604. Although not shown in FIG. 6A, a memory stack including interleaved conductive layers and dielectric layers can be formed at the front side of silicon substrate 602, such that each channel structure 606 extends vertically through the memory stack to doped region 604 in silicon substrate 602.

To form the memory stack, in some embodiments, a dielectric stack including interleaved first dielectric layers (also known as "sacrificial layers") and second dielectric layers (together referred to herein as "dielectric layer pairs") is formed above silicon substrate 602. The dielectric layers and sacrificial layers can be alternatingly deposited on silicon substrate 602 by one or more thin film deposition processes including, but not limited to, chemical vapor deposition (CVD), physical vapor deposition (PVD), atomic layer deposition (ALD), or any combination thereof.

To form channel structures 606, in some embodiments, a plurality of channel holes are simultaneously formed through the dielectric stack using photolithography, development, and etching. The dielectric stack can be etched through by one or more wet etching and/or dry etching processes, such as deep reactive-ion etching (DRIE), using the patterned etching mask to simultaneously form the channel holes in a pattern defined by the photolithography mask and etching mask. In some embodiments, each channel hole extends vertically further into doped region 604 of silicon substrate 602. In some embodiments, a memory film (e.g., including a blocking layer, a storage layer, and a tunneling layer) and a semiconductor channel are subsequently deposited over sidewalls and bottom surfaces of the channel holes in this order using one or more thin film deposition processes, such as ALD, CVD, PVD, any other suitable processes, or any combination thereof. In some embodiments, a capping layer is fully or partially filled in the remaining space of each channel hole by depositing dielectric materials after the deposition of the semiconductor channel. Channel structure 606 are thereby formed, according to some embodiments.

Method 700 proceeds to operation 704, as illustrated in FIG. 7, in which a first doped region is formed in the substrate. In some embodiments, to form the first doped region, part of the substrate is doped through the slit opening. The first doped region is in contact with the second doped region, according to some embodiments. The first doped region can include an N-well.

As illustrated in FIG. 6A, a plurality of doped regions 610, such as N-wells, are formed in silicon substrate 602 using ion implantation, thermal diffusion, or a combination thereof. Doped regions 610 can be formed in contact with doped region 604 to form a plurality of PN-wells. In some embodiments, a plurality of slit openings are etched through the dielectric stack (not shown) using one or more wet etching and/or dry etching processes, such as DRIE, to reach to doped region 604 of silicon substrate 602. In some embodiments, the slit opening extends vertically further into the upper portion of silicon substrate 602. Doped regions 610 can then be formed by doping parts of silicon substrate 602 exposed by the slit openings, for example, by implanting N-type dopants, into the P-well, followed by thermal diffusion.

Method 700 proceeds to operation 706, as illustrated in FIG. 7, in which a first insulating structure extending vertically through the memory stack to the first doped region, and extending laterally to separate the plurality of channel structures into a plurality of blocks is formed. In some embodiments, to form the first insulating structure, the slit opening is filled with one or more dielectric materials.

As illustrated in FIG. 6A, a plurality of insulating structures 608 extending vertically through the memory stack (not shown) to doped regions 610, respectively, are formed. Insulating structure 608 can also extend laterally (e.g., in the y-direction in FIG. 6A) to separate channel structures 606 into memory blocks. Insulating structures 608 can be formed by filling the silt openings with one or more dielectric materials, such as silicon oxide, using one or more thin film deposition processes, such as ALD, CVD, PVD, any other suitable processes, or any combination thereof. In some embodiments, no conductive material is filled into the slit openings. In other words, insulating structures 608 are silt structures that do not include contacts therein.

In some embodiments, prior to the deposition of dielectric materials into the slit openings to form insulating structures 608, a gate replacement process is performed to form the memory stack from the dielectric stack. The sacrificial layers in the dielectric stack can be removed using wet etching and/or dry etching selective to the dielectric layers. The etchant for removing the sacrificial layers can be transported through the silt openings. The conductive layers of the memory stack can be formed by filling the lateral recesses left by the etched sacrificial layers using one or more thin film deposition processes, such as ALD, CVD, PVD, any other suitable processes, or any combination thereof, through the slit openings. In other words, the conductive layers thereby replace the sacrificial layers to transfer the dielectric stack into the memory stack.

Method 700 proceeds to operation 708, as illustrated in FIG. 7, in which a first contact extending vertically from a second side opposite to the first side of the substrate is formed to be in contact with the first doped region. In some embodiments, to form the first contact, a VIA contact is formed. In some embodiments, to form the first contact, a wall-shaped contact is formed. In some embodiments, prior to forming the first contact, a second contact in contact with the second doped region is formed from the first side of the substrate.

Figure 6B:
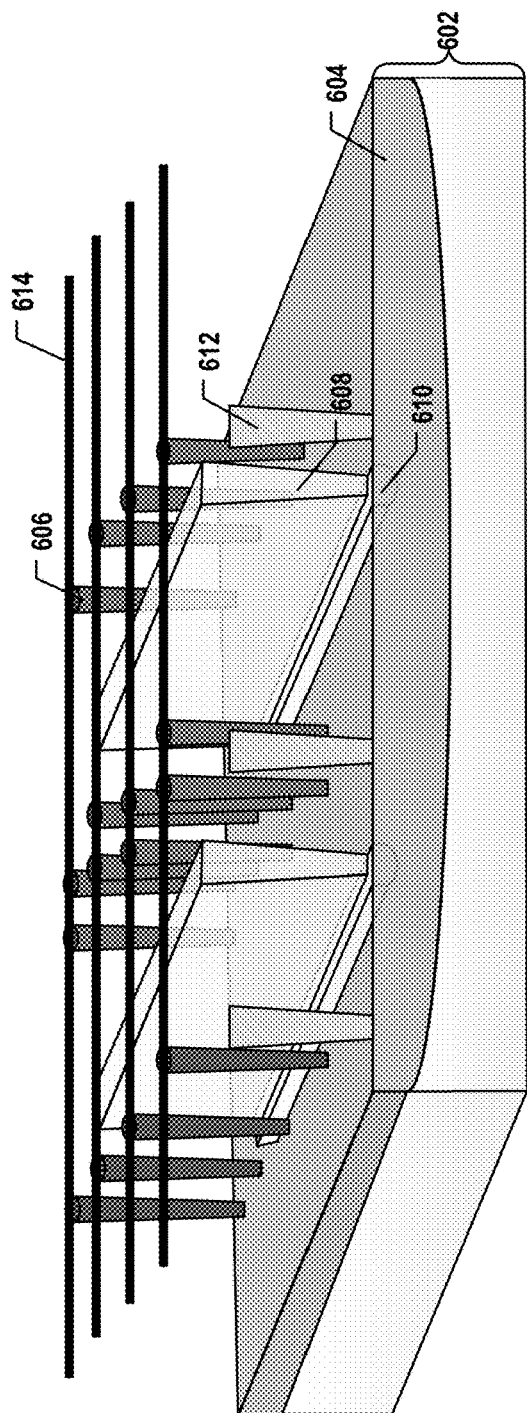

As illustrated in FIG. 6B, one or more contacts 612 are formed at the front side of silicon substrate 602, contacting doped region 604. As described above in detail, the number of contacts 612 may depend on the number of doped region(s) 604 in the final 3D memory device after the fabrication process is completed. For example, if doped region 604 is not further divided into multiple regions (remaining as a single doped region 604), a single contact 612 may be formed. Otherwise, the number of contacts 612 may be the same as the number of doped regions 604 to be divided, such as the same number as the memory blocks divided by insulating structures 608. In some embodiments, contacts 612 are formed by etching through the memory stack (not shown) using DRIE to form contact holes and then filling the contact holes with a dielectric material (as a spacer) and one or more conductive materials using one or more thin film deposition processes, such as ALD, CVD, PVD, any other suitable processes, or any combination thereof. As illustrated in FIG. 6B, interconnects, such as bit lines 614 electrically connected to channel structures 606, can be further formed by one or more thin film deposition processes including, but not limited to, CVD, PVD, ALD, electroplating, electroless plating, or any combination thereof.

Figure 6C:
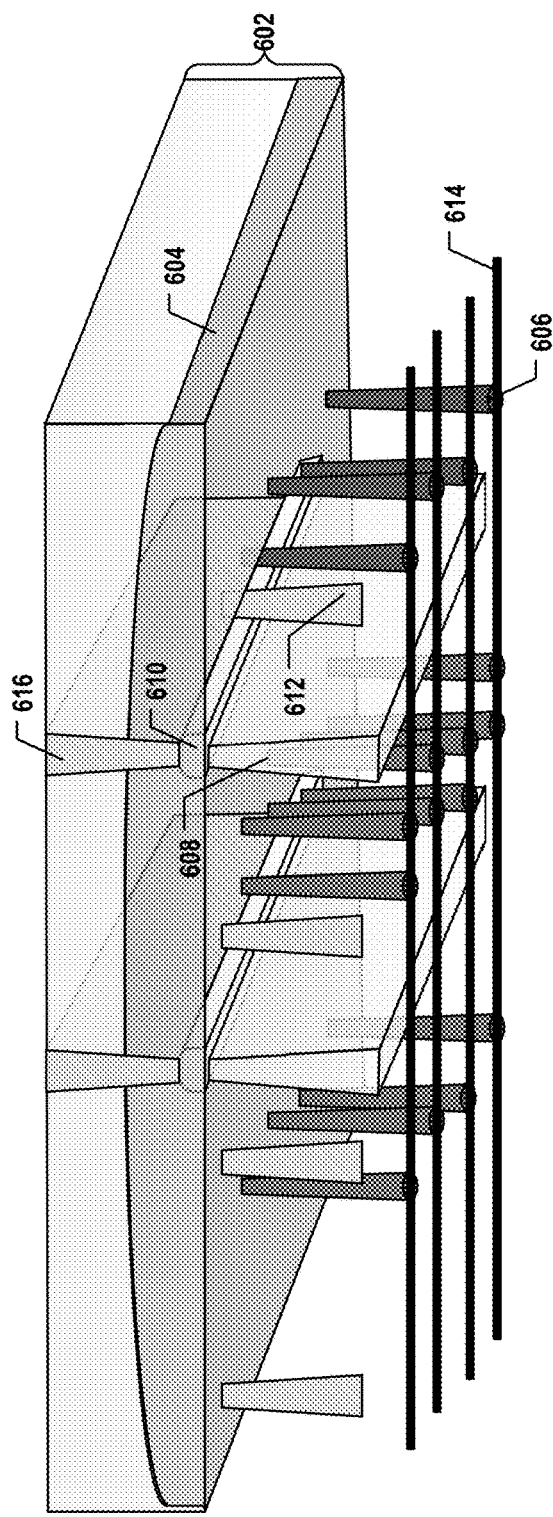
Figure 6D:
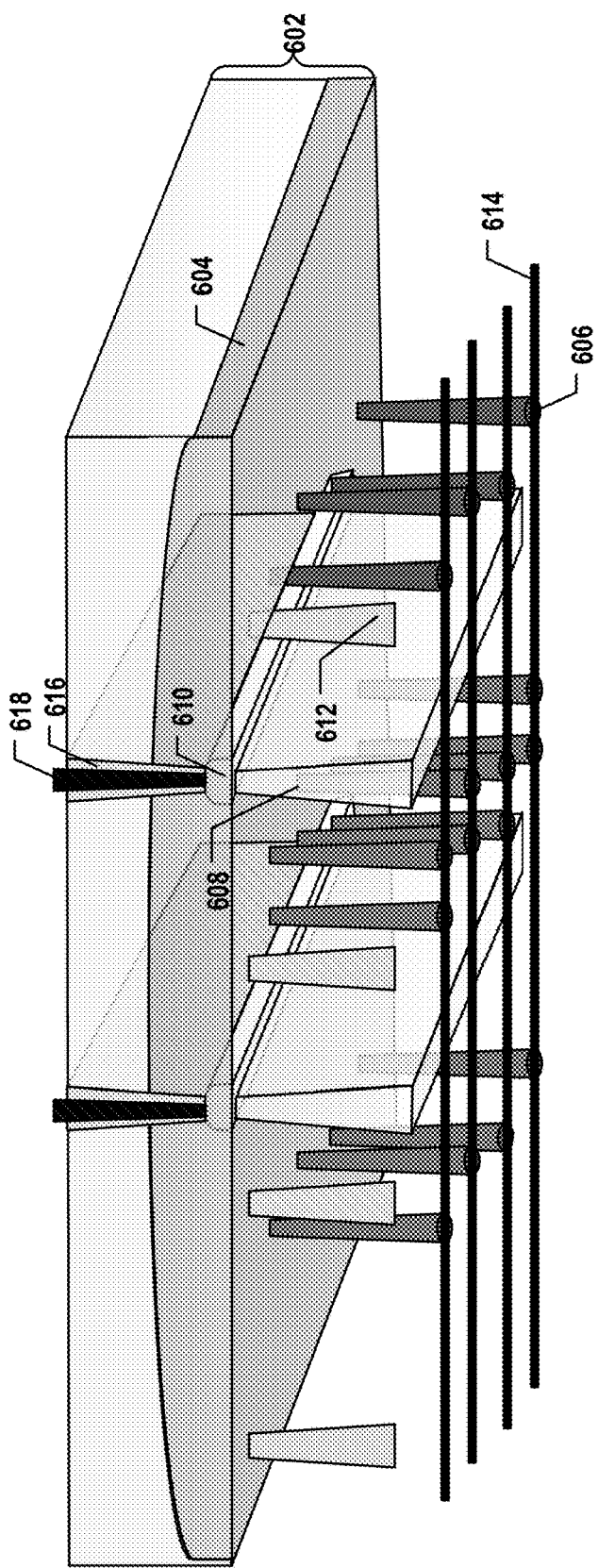

As illustrated in FIG. 6D, a plurality of contacts 618 each extending vertically from the backside of silicon substrate 602 are formed. Each contact 618 can be in contact with a respective one of doped regions 610 in silicon substrate 602. Each contact 618 can be a VIA contact or a wall-type contact extending laterally (e.g., in the y-direction in FIG. 6D). In some embodiments, to form contacts 618, silicon substrate 602 is flipped upside down such that contact holes or trenches can be etched through silicon substrate 602 from its backside using wet etching and/or drying etching, such as DRIE. The etching can be stopped when the contact holes or trenches reach to doped regions 610 by controlling the etching speed and/or duration. One or more conductive materials can be deposited into the contact holes or trenches using one or more thin film deposition processes, such as ALD, CVD, PVD, any other suitable processes, or any combination thereof, thereby forming contacts 618 in contact with doped regions 610, respectively. It is understood that although FIG. 6D further illustrates that contacts 618 are surrounded by backside insulating structures 616 that divide doped regions 604, contacts 618 may be formed without backside insulating structures 616. In other words, without the formation of backside insulating structures 616, doped region 604 can remain a single doped region spanning across multiple memory blocks in the final 3D memory device (e.g., 3D memory device 200 in FIG. 2).

FIG. 8 illustrates a flowchart of another exemplary method 800 for forming a 3D memory device (e.g., 3D memory devices 300 and 301 depicted in FIGS. 3A and 3B), according to some embodiments of the present disclosure. It is understood that the details of the similar processes in both method 700 and method 800 may not be repeated below as methods 700 and 800 share some substantially similar operations. Referring to FIG. 8, method 800 starts at operation 802, in which a doped area in a substrate is formed from a first side of the substrate. The substrate can be a silicon substrate, and the first side can be the front side of the substrate. The doped area includes a P-well, according to some embodiments. Referring to FIG. 6A, doped area 604, such as a P-well, is patterned using photolithography and formed in silicon substrate 602 using ion implantation, thermal diffusion, or a combination thereof.

Method 800 proceeds to operation 804, as illustrated in FIG. 8, in which a plurality of channel structures each extending vertically through a memory stack at the first side of the substrate are formed. In some embodiments, to form the memory stack, a dielectric stack including interleaved sacrificial layers and dielectric layers are formed at the first side of the substrate, a slit opening extending vertically through the dielectric stack to the substrate is formed, and the memory stack including interleaved conductive layers and the dielectric layers is formed by replacing the sacrificial layers with the conductive layers through the slit opening.

Referring to FIG. 6A, channel structures 606 are formed at the front side of silicon substrate 602, contacting doped area 604. Although not shown in FIG. 6A, a memory stack including interleaved conductive layers and dielectric layers can be formed at the front side of silicon substrate 602, such that each channel structure 606 extends vertically through the memory stack to doped area 604 in silicon substrate 602.

Method 800 proceeds to operation 806, as illustrated in FIG. 8, in which a first doped region in contact with the doped area is formed in the substrate. In some embodiments, to form the first doped region, part of the substrate is doped through the slit opening. The first doped region can include an N-well.

As illustrated in FIG. 6A, doped regions 610, such as N-wells, are formed in silicon substrate 602 using ion implantation, thermal diffusion, or a combination thereof. Doped regions 610 can be formed in contact with doped area 604 to form a plurality of PN-wells. In some embodiments, a plurality of slit openings are etched through the dielectric stack (not shown) using one or more wet etching and/or dry etching processes, such as DRIE, to reach to doped area 604 of silicon substrate 602. In some embodiments, the slit opening extends vertically further into the upper portion of silicon substrate 602. Doped regions 610 can then be formed by doping parts of silicon substrate 602 exposed by the slit openings, for example, using implanting N-type dopants, into the P-well, followed by thermal diffusion.

Method 800 proceeds to operation 808, as illustrated in FIG. 8, in which a slit structure extending vertically through the memory stack to the first doped region, and extending laterally to separate the plurality of channel structures into a plurality of blocks is formed. In some embodiments, to form the slit structure, the slit opening is subsequently deposited with a spacer and a wall-typed contact.

Although FIG. 6A shows insulating structures 608 filled with dielectric materials, it is understood that in some embodiments, a plurality slit structures each including a spacer and a wall-typed contact may replace insulating structures 608 in the final 3D memory device. The slit structures can extend vertically through the memory stack (not shown) to doped regions 610, respectively, and also extend laterally (e.g., in the y-direction in FIG. 6A) to separate channel structures 606 into memory blocks. The slit structure can be formed by subsequently depositing one or more dielectric materials (as the spacer) and one or more conductive materials (as the contact) using one or more thin film deposition processes, such as ALD, CVD, PVD, any other suitable processes, or any combination thereof.

Method 800 proceeds to operation 812, as illustrated in FIG. 8, in which an insulating structure extending vertically from the second side of the substrate to the first doped region is formed to separate the doped area into a plurality of second doped regions. To form the insulating structure, a trench is etched from the second side of the substrate until the first doped region, and the trench is filled with one or more dielectric materials, according to some embodiments.

As illustrated in FIG. 6C, silicon substrate 602 is flipped upside down, and a plurality of insulating structures 616 are formed from the backside of silicon substrate 602 to separate a single doped area 604 into multiple doped regions 604. Each insulating structure 616 can extend vertically from the backside of silicon substrate 602 to a respective one of doped regions 610. In some embodiments, each insulating structure 616 also extends laterally (e.g., in the y-direction in FIG. 6C). To form insulating structures 616, a plurality of trenches are patterned from the backside of silicon substrate 602 to be aligned with doped regions 610, respectively, using photolithography, followed by wet etching and/or dry etching, such as DRIE. The etching speed and/or duration can be controlled, such that the etching stops when the trenches reach to doped regions 610. One or more dielectric materials, such as silicon oxide, can be deposited into the trenches using one or more thin film deposition processes, such as ALD, CVD, PVD, any other suitable processes, or any combination thereof. In some embodiments, no conductive material is deposited into the trenches. That is, source contacts may be formed at the front side of silicon substrate 602 in the slit structures, as opposed to at the backside of silicon substrate 602, in the final 3D memory device (e.g., 3D memory device 300 in FIG. 3A or 3D memory device 301 in FIG. 3B).

Method 800 further includes an operation of forming a plurality of contacts each in contact with a respective one of the second doped regions for controlling the voltage of the corresponding second doped region. The formation of the contacts can occur at operation 810 prior to operation 812 or at operation 814 after operation 812.

Optionally, at operation 810, a plurality of contacts each in contact with the doped area are formed from the first side of the substrate. As illustrated in FIG. 6B, contacts 612 are formed at the front side of silicon substrate 602, contacting doped area 604. As described above in detail, the number of contacts 612 may be the same as the number of doped regions 604 to be divided by insulating structures 616 (shown in FIG. 6C). In some embodiments, contacts 612 are formed by etching through the memory stack (not shown) using DRIE to form contact holes and then filling the contact holes with a dielectric material (as a spacer) and one or more conductive materials using one or more thin film deposition processes, such as ALD, CVD, PVD, any other suitable processes, or any combination thereof.

Optionally, at operation 814, a plurality of contacts each in contact with a respective one of the second doped regions are formed from the second side of the substrate. Although not shown in FIG. 6C, a plurality of contacts may be are formed at the backside of silicon substrate 602, contacting doped regions 604, respectively. As described above in detail, the number of the contacts may be the same as the number of doped regions 604. In some embodiments, the contacts are formed by etching silicon substrate 602 using DRIE until doped regions 604 to form contact holes and then filling the contact holes with a dielectric material (as a spacer) and one or more conductive materials using one or more thin film deposition processes, such as ALD, CVD, PVD, any other suitable processes, or any combination thereof.

FIG. 9 illustrates a flowchart of another exemplary method 900 for forming a 3D memory device (e.g., 3D memory devices 400 and 401 depicted in FIGS. 4A and 4B), according to some embodiments of the present disclosure. It is understood that the same operations in method 700, method 800, and method 900 may not be repeated in detail for ease of description.

Referring to FIG. 9, method 900 starts at operation 802, in which a doped area in a substrate is formed from a first side of the substrate. Method 900 proceeds to operation 804, as illustrated in FIG. 9, in which a plurality of channel structures each extending vertically through a memory stack at the first side of the substrate are formed. Method 900 proceeds to operation 806, as illustrated in FIG. 9, in which a first doped region in contact with the doped area is formed in the substrate. Method 900 proceeds to operation 706, as illustrated in FIG. 9, in which a first insulating structure extending vertically through the memory stack to the first doped region, and extending laterally to separate the plurality of channel structures into a plurality of blocks is formed. Optionally, method 900 proceeds to operation 810, as illustrated in FIG. 9, in which a plurality of first contacts each in contact with the doped area are formed from the first side of the substrate. Method 900 proceeds to operation 812, as illustrated in FIG. 9, in which a second insulating structure extending vertically from the second side of the substrate to the first doped region is formed to separate the doped area into a plurality of second doped regions.

Method 900 proceeds to operation 902, as illustrated in FIG. 9, in which a second contact extending vertically through the second insulating structure from the second side of the substrate is formed to be in contact with the first doped region. In some embodiments, to form the second contact, a VIA contact is formed. In some embodiments, to form the second contact, a wall-shaped contact is formed.

As illustrated in FIG. 6D, a plurality of contacts 618 each extending vertically through a respective one of insulating structures 616 from the backside of silicon substrate 602 are formed. Each contact 618 can be in contact with a respective one of doped regions 610 in silicon substrate 602. Each contact 618 can be a VIA contact or a wall-type contact extending laterally (e.g., in the y-direction in FIG. 6D). In some embodiments, to form contacts 618, silicon substrate 602 is flipped upside down such that contact holes or trenches can be etched through insulating structures 616 from the backside of silicon substrate 602 using wet etching and/or drying etching, such as DRIE. The contact holes or trenches can be patterned from the backside of silicon substrate 602 to be aligned with insulating structures 616, respectively, using photolithography. The etching can be stopped when the contact holes or trenches reach to doped regions 610 by controlling the etching speed and/or duration. One or more conductive materials can be deposited into the contact holes or trenches using one or more thin film deposition processes, such as ALD, CVD, PVD, any other suitable processes, or any combination thereof, thereby forming contacts 618 in contact with doped regions 610, respectively. Backside source contact 618 surrounded by backside insulating structures 616 can be thereby formed in the final 3D memory device (e.g., 3D memory device 400 in FIG. 4A or 3D memory device 401 in FIG. 4B).

Optionally, method 900 proceeds to operation 814, as illustrated in FIG. 9, in which a plurality of first contacts each in contact with a respective one of the second doped regions from the second side of the substrate are formed.

According to one aspect of the present disclosure, a 3D memory device includes a substrate having a first side and a second side opposite to the first side. The 3D memory device also includes a memory stack including interleaved conductive layers and dielectric layers at the first side of the substrate. The 3D memory device also includes a plurality of channel structures each extending vertically through the memory stack. The 3D memory device also includes a slit structure extending vertically through the memory stack and extending laterally to separate the plurality of channel structures into a plurality of blocks. The 3D memory device further includes a first doped region in the substrate and in contact with the slit structure. The 3D memory device further includes an insulating structure extending vertically from the second side of the substrate to the first doped region. The 3D memory device further includes a plurality of second doped regions in the substrate and separated by the insulating structure.

In some embodiments, the insulating structure includes a trench isolation.

In some embodiments, the second doped regions are in contact with the first doped region and are separated into the blocks by the insulating structure and the first doped region.

In some embodiments, the one or more channel structures in each of the blocks are in contact with a respective one of the second doped regions in the block.

In some embodiments, the 3D memory device further includes a plurality of first contacts each in contact with a respective one of the second doped regions for controlling the voltage of the corresponding second doped region. In some embodiments, the first contacts extend to the first side of the substrate. In some embodiments, the first contacts extend to the second side of the substrate.

In some embodiments, the first doped region includes an N-well, and each of the second doped regions includes a P-well.

In some embodiments, the 3D memory device further includes a second contact surrounded by the insulating structure and extending vertically from the second side of the substrate to be in contact with the first doped region.

In some embodiments, the slit structure is filled with one or more dielectric materials.

According to another aspect of the present disclosure, a 3D memory device includes a first semiconductor structure including a peripheral circuit, a second semiconductor structure, and a joining interface between the first semiconductor structure and the second semiconductor structure. The second semiconductor structure includes a memory stack including interleaved conductive layers and dielectric layers. The second semiconductor structure also includes a plurality of channel structures each extending vertically through the memory stack and electrically connected to the peripheral circuit. The second semiconductor structure also includes a plurality of slit structures each extending vertically through the memory stack and extending laterally to separate the plurality of channel structures into a plurality of blocks. The second semiconductor structure further includes a semiconductor layer including a plurality of first doped regions each in contact with a respective one of the plurality of slit structures, and a plurality of second doped regions in contact with the plurality of first doped regions. The second semiconductor structure further includes a plurality of insulating structures each extending vertically from a backside of the semiconductor layer to a respective one of the plurality of first doped regions to separate the plurality of second doped regions into the blocks.

In some embodiments, each of the insulating structures includes a trench isolation.

In some embodiments, the one or more channel structures in each of the blocks are in contact with a respective one of the second doped regions in the block.

In some embodiments, the 3D memory device further includes a plurality of contacts each in contact with a respective one of the second doped regions for controlling the voltage of the corresponding second doped region. In some embodiments, the contacts extend to a front side of the semiconductor layer. In some embodiments, the contacts extend to the backside of the semiconductor layer.

In some embodiments, the first doped region includes an N-well, and each of the second doped regions includes a P-well.

According to still another aspect of the present disclosure, a method for forming a 3D memory device is disclosed. A doped area is formed from a first side of a substrate in the substrate. A plurality of channel structures each extending vertically through a memory stack at the first side of a substrate are formed. A first doped region is formed in the substrate and in contact with the doped area. A slit structure extending vertically through the memory stack to the first doped region, and extending laterally to separate the plurality of channel structures into a plurality of blocks is formed. An insulating structure extending vertically from the second side of the substrate to the first doped region is formed to separate the doped area into a plurality of second doped regions.

In some embodiments, a dielectric stack including interleaved sacrificial layers and dielectric layers is formed at the first side of the substrate, a slit opening extending vertically through the dielectric stack to the substrate is formed, and the memory stack including interleaved conductive layers and the dielectric layers is formed by replacing the sacrificial layers with the conductive layers through the slit opening.

In some embodiments, to form the first doped region, part of the substrate is doped through the slit opening.

In some embodiments, to form the insulating structure, a trench is etched from the second side of the substrate until the first doped region, and the trench is filled with one or more dielectric materials.

In some embodiments, a plurality of first contacts each in contact with a respective one of the second doped regions for controlling the voltage of the corresponding second doped region are formed. In some embodiments, to form the first contacts, the first contacts are formed from the first side of the substrate. In some embodiments, to form the first contacts, the first contacts are formed from the second side of the substrate.

In some embodiments, the first doped region includes an N-well, and each of the second doped regions includes a P-well.

In some embodiments, a second contact extending vertically through the insulating structure to be in contact with the first doped region is formed.

The foregoing description of the specific embodiments will so reveal the general nature of the present disclosure that others can, by applying knowledge within the skill of the art, readily modify and/or adapt for various applications of such specific embodiments, without undue experimentation, and without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
a substrate having a first side and a second side opposite to the first side;
a memory stack comprising interleaved conductive layers and dielectric layers at the first side of the substrate;
a plurality of channel structures each extending vertically through the memory stack;
a slit structure extending vertically through the memory stack and extending laterally to separate the plurality of channel structures into a plurality of blocks;
a first doped region in the substrate and in contact with the slit structure;
an insulating structure extending vertically from the second side of the substrate to the first doped region; and
a plurality of second doped regions in the substrate and separated by the insulating structure,
wherein the insulating structure comprises a trench isolation filled with one or more dielectric materials without any conductive material deposited in the trench isolation.

2. The 3D memory device of claim 1, wherein the second doped regions are in contact with the first doped region and are separated into the blocks by the insulating structure and the first doped region.

3. The 3D memory device of claim 2, wherein the one or more channel structures in each of the blocks are in contact with a respective one of the second doped regions in the block.

4. The 3D memory device of claim 1, further comprising a plurality of first contacts each in contact with a respective one of the second doped regions for controlling a voltage of the corresponding second doped region.

5. The 3D memory device of claim 4, wherein the first contacts extend to the first side of the substrate.

6. The 3D memory device of claim 4, wherein the first contacts extend to the second side of the substrate.

7. The 3D memory device of claim 1, wherein the first doped region comprises an N-well, and each of the second doped regions comprises a P-well.

8. The 3D memory device of claim 1, wherein the slit structure is filled with one or more dielectric materials.

9. A three-dimensional (3D) memory device, comprising:
a first semiconductor structure comprising a peripheral circuit;
a second semiconductor structure comprising:
a memory stack comprising interleaved conductive layers and dielectric layers;
a plurality of channel structures each extending vertically through the memory stack and electrically connected to the peripheral circuit;
a plurality of slit structures each extending vertically through the memory stack and extending laterally to separate the plurality of channel structures into a plurality of blocks;
a semiconductor layer comprising a plurality of first doped regions each in contact with a respective one of the plurality of slit structures, and a plurality of second doped regions in contact with the plurality of first doped regions;
a plurality of insulating structures each extending vertically from a backside of the semiconductor layer to a respective one of the plurality of first doped regions to separate the plurality of second doped regions into the blocks; and
a plurality of contacts each in contact with a respective one of the second doped regions; and
a joining interface between the first semiconductor structure and the second semiconductor structure.

10. The 3D memory device of claim 9, wherein each of the insulating structures comprises a trench isolation.

11. The 3D memory device of claim 9, wherein one or more channel structures in each of the blocks are in contact with a respective one of the second doped regions in the block.

12. The 3D memory device of claim 9, wherein the contacts extend to a front side of the semiconductor layer.

13. The 3D memory device of claim 9, wherein the contacts extend to the backside of the semiconductor layer.

14. The 3D memory device of claim 9, wherein the first doped region comprises an N-well, and each of the second doped regions comprises a P-well.

15. The 3D memory device of claim 9, wherein the plurality of insulating structures each comprises a trench isolation filled with one or more dielectric materials without any conductive material deposited in the trench isolation.

16. A method for forming a three-dimensional (3D) memory device, comprising:
forming, from a first side of a substrate, a doped area in the substrate;
forming a plurality of channel structures each extending vertically through a memory stack at the first side of the substrate;
forming a first doped region in the substrate and in contact with the doped area;
forming a slit structure extending vertically through the memory stack to the first doped region, and extending laterally to separate the plurality of channel structures into a plurality of blocks; and
forming an insulating structure extending vertically from a second side of the substrate to the first doped region to separate the doped area into a plurality of second doped regions,
wherein the insulating structure comprises a trench isolation filled with one or more dielectric materials without any conductive material deposited in the trench isolation.

17. The method of claim 16, further comprising:
- forming a dielectric stack comprising interleaved sacrificial layers and dielectric layers at the first side of the substrate;
- forming a slit opening extending vertically through the dielectric stack to the substrate; and
- forming the memory stack comprising interleaved conductive layers and the dielectric layers by replacing the sacrificial layers with the conductive layers through the slit opening.

18. The method of claim 17, wherein forming the first doped region comprises doping part of the substrate through the slit opening.

19. The method of claim 16, wherein forming the insulating structure comprises:
- etching, from the second side of the substrate, a trench until the first doped region; and
- filling the trench with one or more dielectric materials.

20. The method of claim 16, further comprising forming a plurality of first contacts each in contact with a respective one of the second doped regions for controlling a voltage of the corresponding second doped region.

\* \* \* \* \*